(12) United States Patent
Myeong et al.

(10) Patent No.: US 11,221,648 B2
(45) Date of Patent: Jan. 11, 2022

(54) FOLDABLE DISPLAY DEVICE

(71) Applicant: Samsung Display Co., Ltd., Yongin-si (KR)

(72) Inventors: Mansik Myeong, Seoul (KR); Jai Ku Shin, Hwaseong-si (KR); Gil Jae Choi, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/890,536

(22) Filed: Jun. 2, 2020

(65) Prior Publication Data

US 2021/0072790 A1    Mar. 11, 2021

(30) Foreign Application Priority Data

Sep. 9, 2019  (KR) .................. 10-2019-0111506

(51) Int. Cl.
*G06F 1/16*  (2006.01)

(52) U.S. Cl.
CPC .......... *G06F 1/1616* (2013.01); *G06F 1/1652* (2013.01); *G06F 1/1681* (2013.01)

(58) Field of Classification Search
CPC combination set(s) only.
See application file for complete search history.

(56) References Cited

U.S. PATENT DOCUMENTS

| | | | |
|---|---|---|---|
| 9,651,998 B2 * | 5/2017 | Matsueda | H04M 1/0216 |
| 9,826,626 B2 * | 11/2017 | Myeong | G06F 1/1652 |
| 9,905,795 B2 * | 2/2018 | Matsueda | H04M 1/0268 |
| 9,910,458 B2 * | 3/2018 | Watanabe | G02F 1/133305 |
| 9,980,373 B2 * | 5/2018 | Jeong | G05B 11/01 |
| 10,198,041 B2 * | 2/2019 | Myeong | G02F 1/133305 |
| 10,215,332 B2 * | 2/2019 | Lee | G06F 1/1616 |
| 10,495,941 B2 * | 12/2019 | Hashimoto | E05D 3/122 |
| 10,504,971 B2 * | 12/2019 | Yang | H01L 27/3272 |
| 10,620,668 B2 * | 4/2020 | Park | G06F 1/1652 |
| 10,686,028 B2 * | 6/2020 | Ahn | H01L 27/3276 |
| 10,754,382 B2 * | 8/2020 | Nam | H05K 5/0017 |
| 10,838,457 B2 * | 11/2020 | Yu | G06F 1/1652 |
| 2014/0111954 A1 * | 4/2014 | Lee | G06F 1/1652 361/749 |
| 2015/0220117 A1 | 8/2015 | Lee et al. | |
| 2019/0305238 A1 * | 10/2019 | Shin | H01L 27/323 |
| 2019/0334114 A1 * | 10/2019 | Park | G06F 1/1641 |

(Continued)

FOREIGN PATENT DOCUMENTS

| | | |
|---|---|---|
| KR | 10-2015-0092773 | 8/2015 |
| KR | 10-2016-0056445 | 5/2016 |

(Continued)

*Primary Examiner* — Lisa Lea-Edmonds

(74) *Attorney, Agent, or Firm* — H.C. Park & Associates, PLC

(57) ABSTRACT

A foldable display device includes: a flexible display module including a bendable area having a folding axis and substantially planar members respectively located at opposite sides of the bendable area; and a support disposed on the flexible display module and including a hinge portion and support members, each of the support members being rotatably supported by one of opposite sides of the hinge portion, wherein at least a portion of the folding axis overlaps at least one of the support members in a plan view.

18 Claims, 17 Drawing Sheets

(56) References Cited

U.S. PATENT DOCUMENTS

| | | | |
|---|---|---|---|
| 2019/0357366 A1 | 11/2019 | Choi et al. | |
| 2020/0133344 A1* | 4/2020 | Park | G06F 1/1652 |
| 2020/0166972 A1* | 5/2020 | Park | G06F 1/1635 |
| 2020/0274098 A1* | 8/2020 | Shin | H05K 1/0281 |
| 2021/0018962 A1* | 1/2021 | de la Fuente | G06F 1/1616 |
| 2021/0064086 A1* | 3/2021 | Choi | H04M 1/0268 |
| 2021/0068276 A1* | 3/2021 | Kim | H05K 5/0017 |
| 2021/0083213 A1* | 3/2021 | Shin | H01L 27/323 |

FOREIGN PATENT DOCUMENTS

| | | |
|---|---|---|
| KR | 10-2018-0030422 | 3/2018 |
| KR | 10-2019-0132604 | 11/2019 |

\* cited by examiner

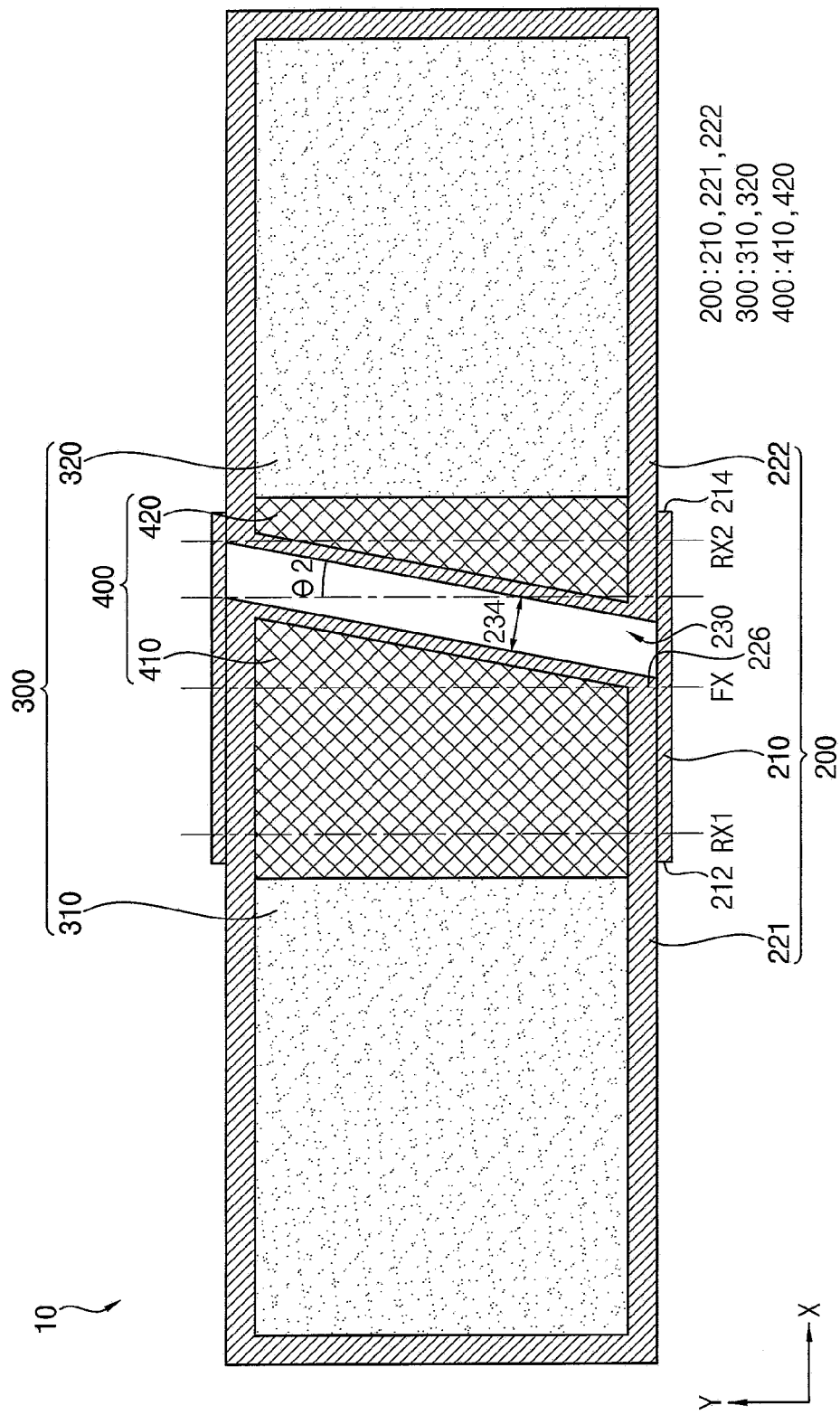

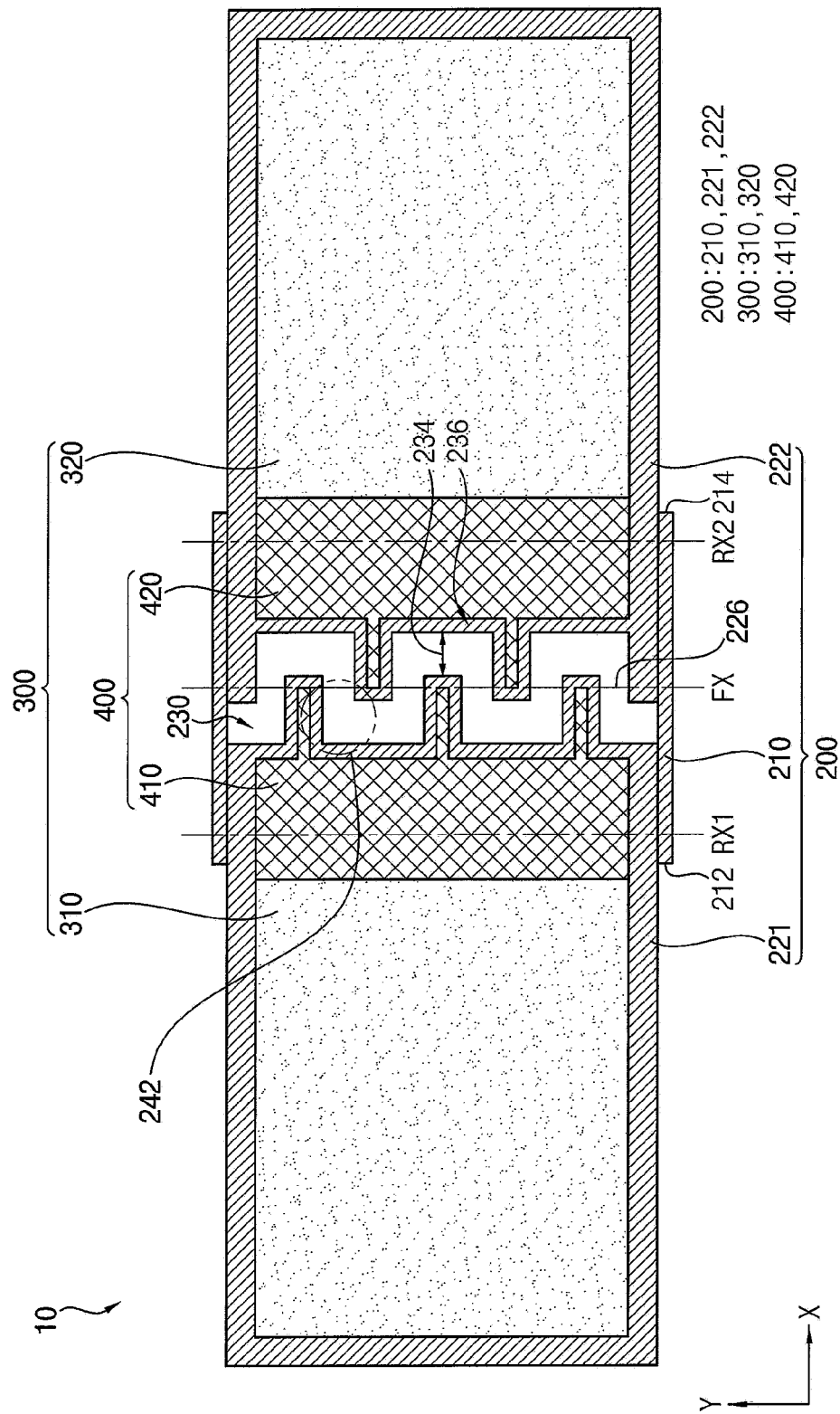

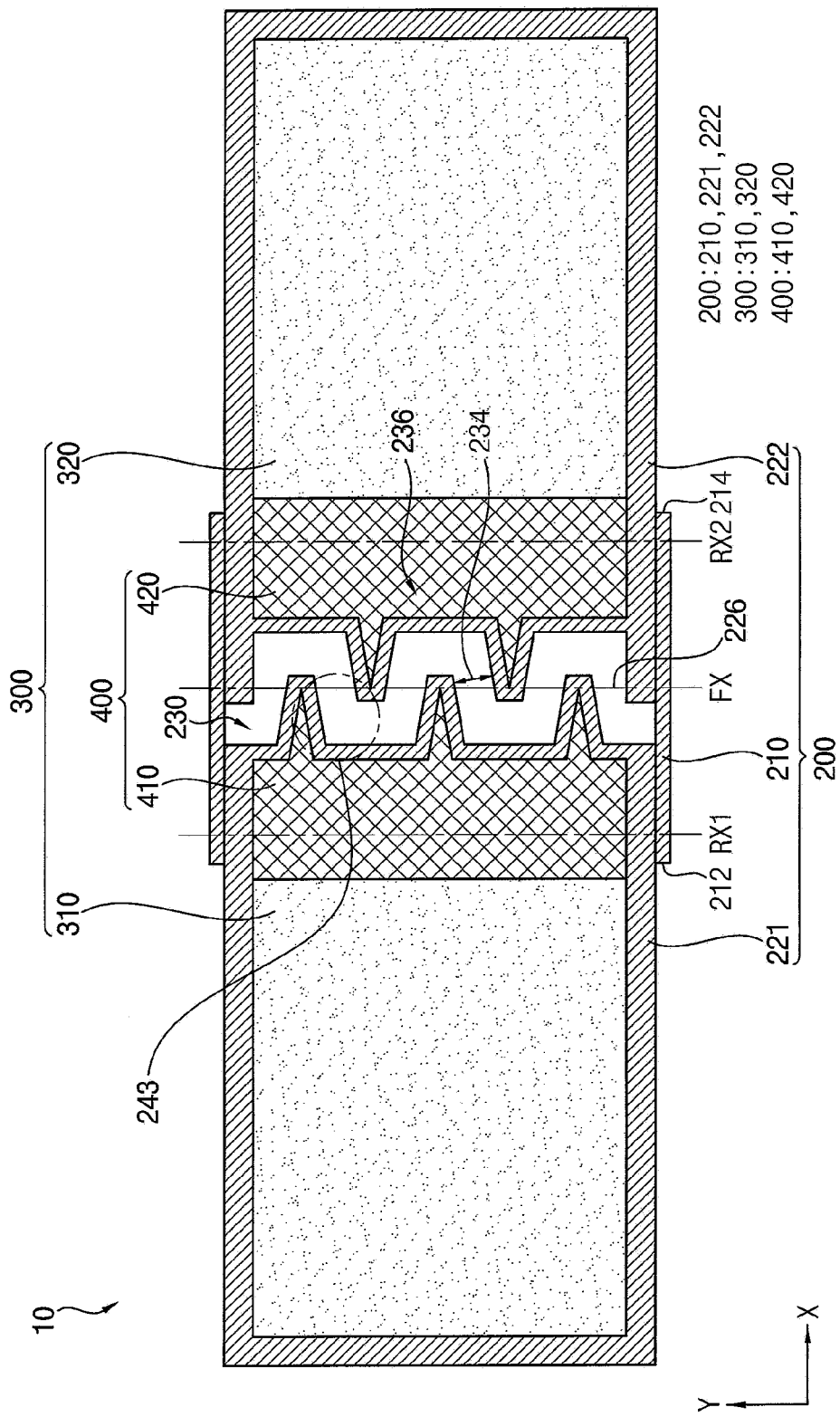

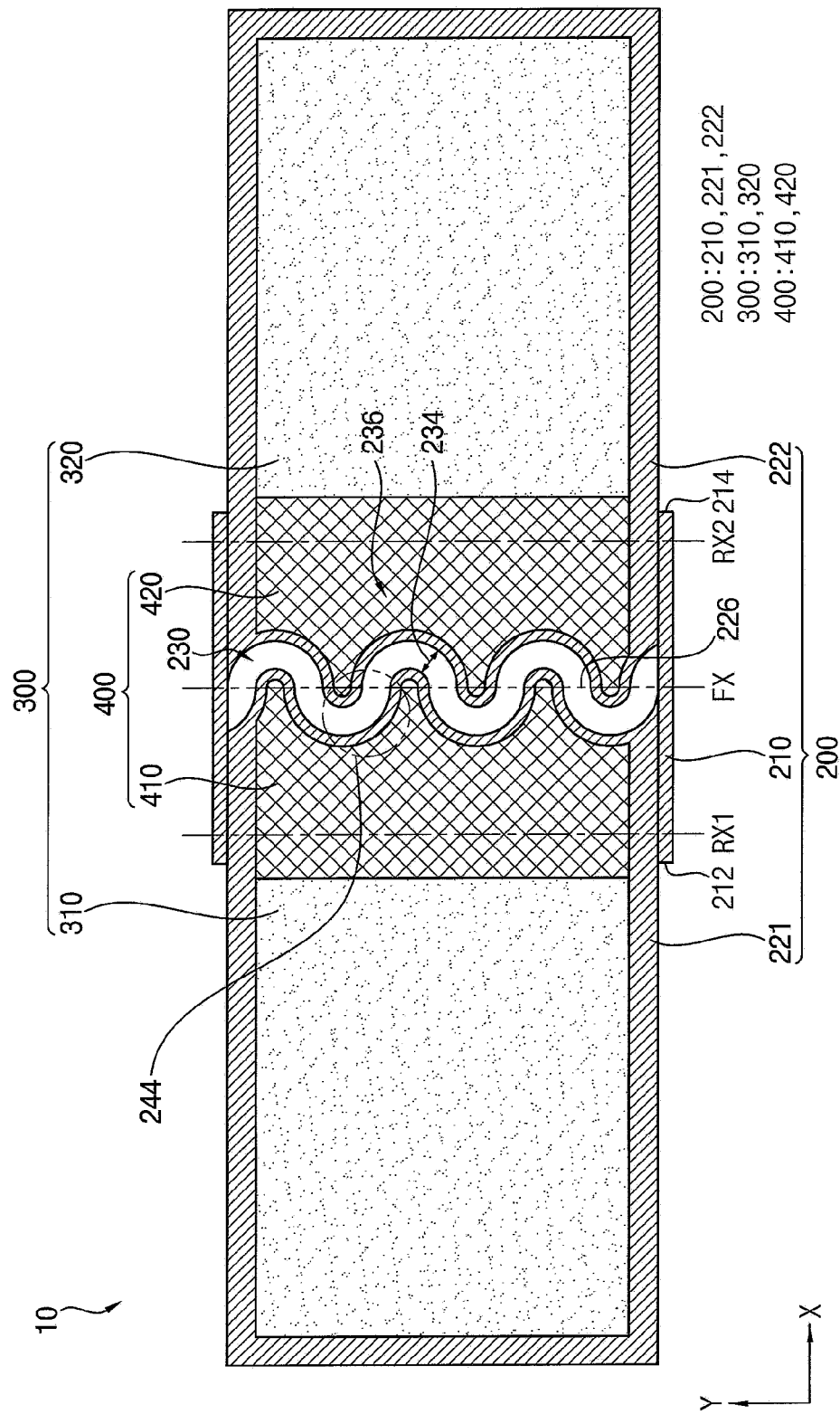

FOLDABLE DISPLAY DEVICE

CROSS-REFERENCE TO RELATED APPLICATION

This application claims priority from and the benefit of Korean Patent Application No. 10-2019-0111506, filed on Sep. 9, 2019, which is hereby incorporated by reference for all purposes if fully set forth herein.

BACKGROUND

Field

Exemplary implementations relate to a display device and, more particularly to, a foldable display device.

Discussion of the Background

A display device may display images to provide information to users. Recently, a flexible display device that can be deformed in various forms has been developed. Unlike a flat display device, the flexible display device may be foldable, rollable or bendable like a piece of paper. The flexible display device may be easily portable, and may improve convenience of users.

The above information disclosed in this Background section is only for understanding of the background of the inventive concepts, and, therefore, it may contain information that does not constitute prior art.

SUMMARY

Applicant discovered that the bendable area of foldable display devices develops wrinkles or creases after repeated folding or bending.

Foldable display devices constructed according to the principles of and exemplary implementations of the invention minimize the amount of wrinkle deformation in the bendable area. For example, at least a portion of the folding axis may overlap the members that support bending or may not overlap the space between them so that amount of the wrinkle deformation of the flexible display module may be minimized.

Additional features of the inventive concepts will be set forth in the description which follows, and in part will be apparent from the description, or may be learned by practice of the inventive concepts.

According to an aspect of the invention, a foldable display device includes: a flexible display module including a bendable area having a folding axis and substantially planar members respectively located at opposite sides of the bendable area; and a support disposed on the flexible display module and including a hinge portion and support members, each of the support members being rotatably supported by one of opposite sides of the hinge portion, wherein at least a portion of the folding axis overlaps at least one of the support members in a plan view.

A space between the support members may not overlap the folding axis in a plan view.

The space between the support members may generally be parallel to the folding axis in a plan view.

The space between the support members may be angled relative to the folding axis in a plan view.

A space between the support members at least partially may overlap and be angled relative to the folding axis in a plan view.

A space between the support members may be a generally zigzag shape in a plan view.

The zigzag shape may be a bent portion that is angled.

The bent portion may be an acute angle shape, a right-angle shape, or an obtuse angle shape.

The zigzag shape may be a bent portion that is curved.

The support may include a case including a hinged portion; and the hinge portion includes axes about which the support members respectively rotate, and a space between the support members is located between the rotating axes in a plan view.

The axes may be symmetric with respect to the folding axis in a plan view.

Adhesive members may respectively be disposed between the substantially planar members and the support members; and spacers respectively disposed between the bendable area of the flexible display module and the support members.

The spacers may include step difference compensation members each of which is has a thickness less than or equal to the thickness of each of the adhesive members.

The space between the spacers may have a width greater than the width of the space between the support members.

An adhesive member may be disposed between the flexible display module and the support members.

The adhesive member may include a first area overlapping the substantially planar members and attached to the support members and a second area overlapping the bendable area and not attached to the support members.

According to another aspect of the invention, a foldable display device includes: a flexible display module including a bendable area having a folding axis and substantially planar members respectively located at opposite sides of the bendable area; and a support disposed on the flexible display module and including support members respectively supporting the planar members and spaced apart from each other with a space therebetween, wherein at least a portion of the folding axis does not overlap the space between the support members in a plan view.

The space between the support members may not overlap and be generally parallel to the folding axis in a plan view.

The space between the support members may at least partially overlap and be angled to the folding axis in a plan view.

The space between the support members may have a zigzag shape in a plan view.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

FIG. 10 is a plan view of yet another exemplary embodiment of a foldable display device constructed according to principles of the invention.

FIGS. 11A, 11B, 11C, and 11D are plan views of other exemplary embodiments of foldable display devices constructed according to principles of the invention.

DETAILED DESCRIPTION

Figure 1:
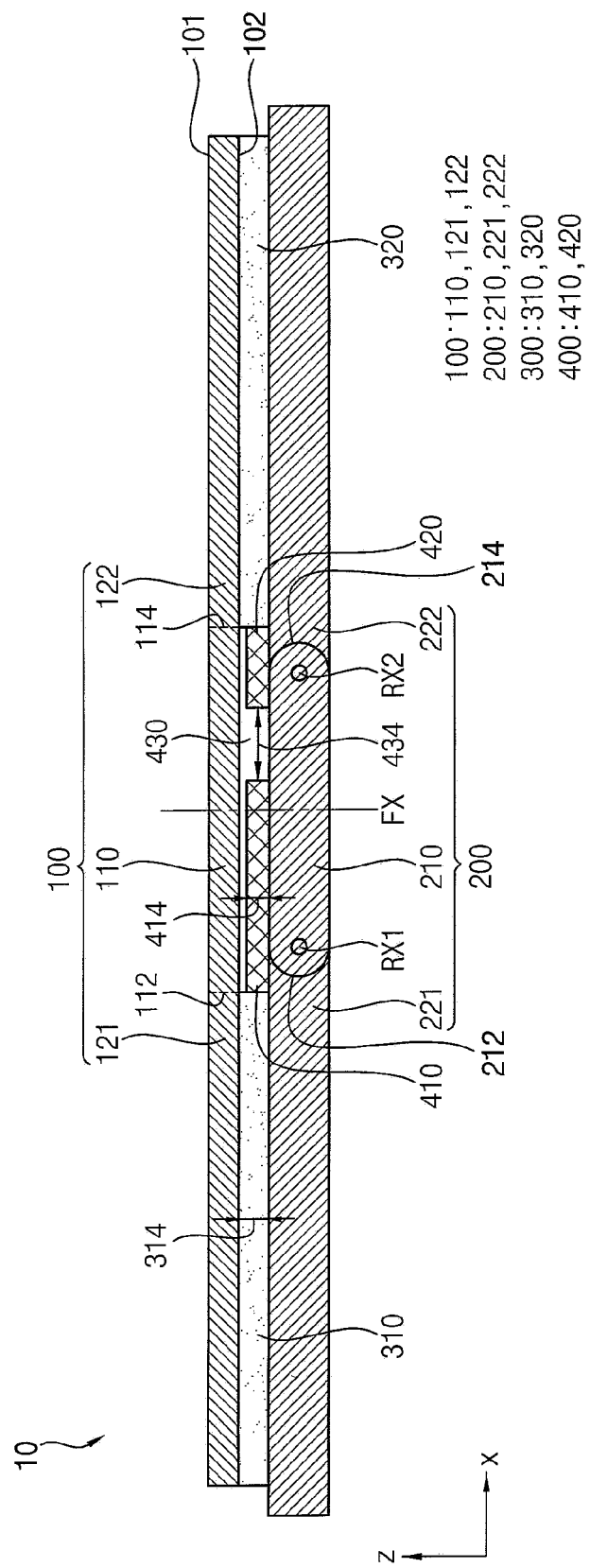
FIG. 1 is an elevational view of an exemplary embodiment of a foldable display device constructed according to principles of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
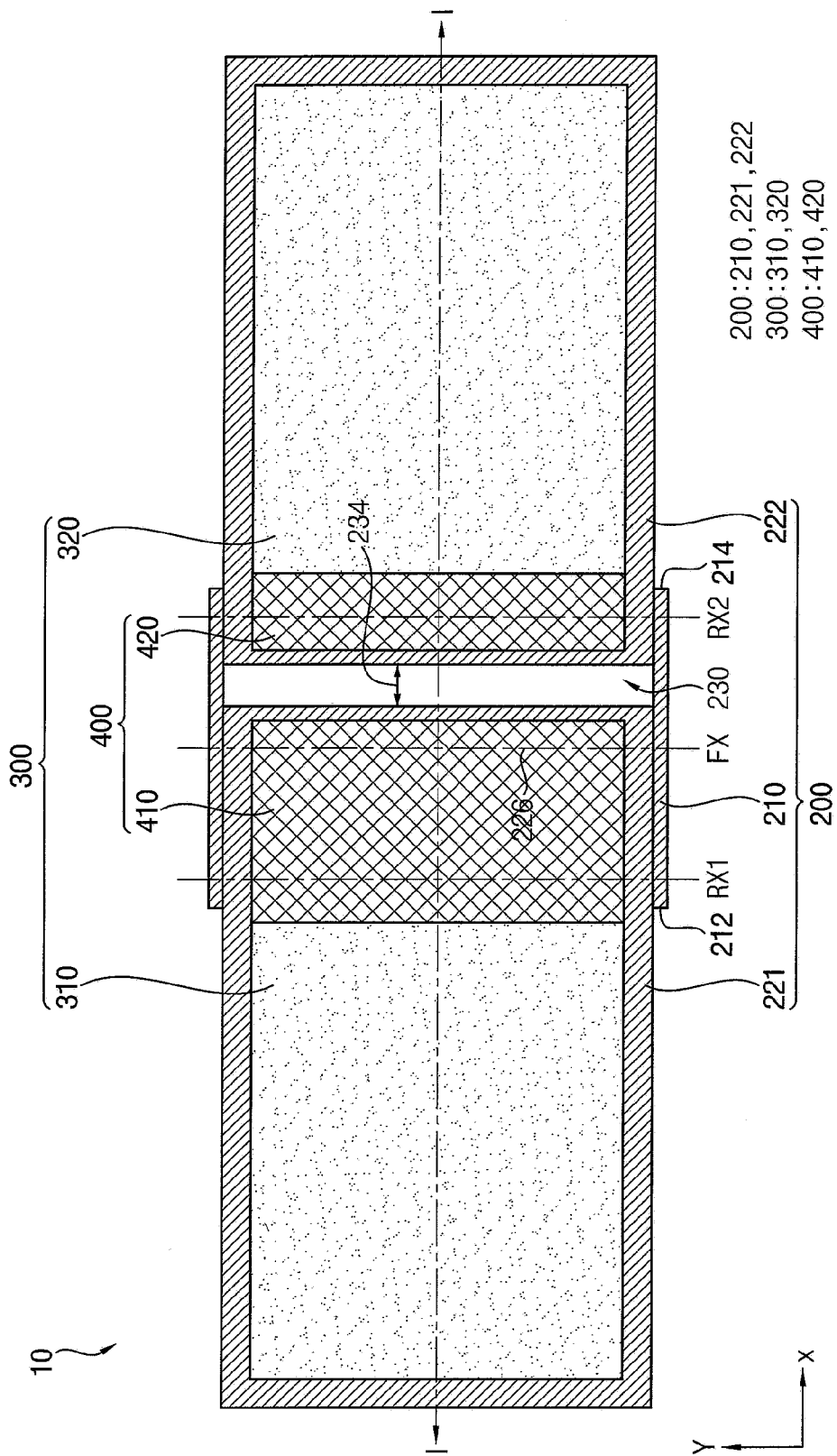
FIG. 2 is a plan view illustrating the foldable display device of FIG. 1.
Figure 3:
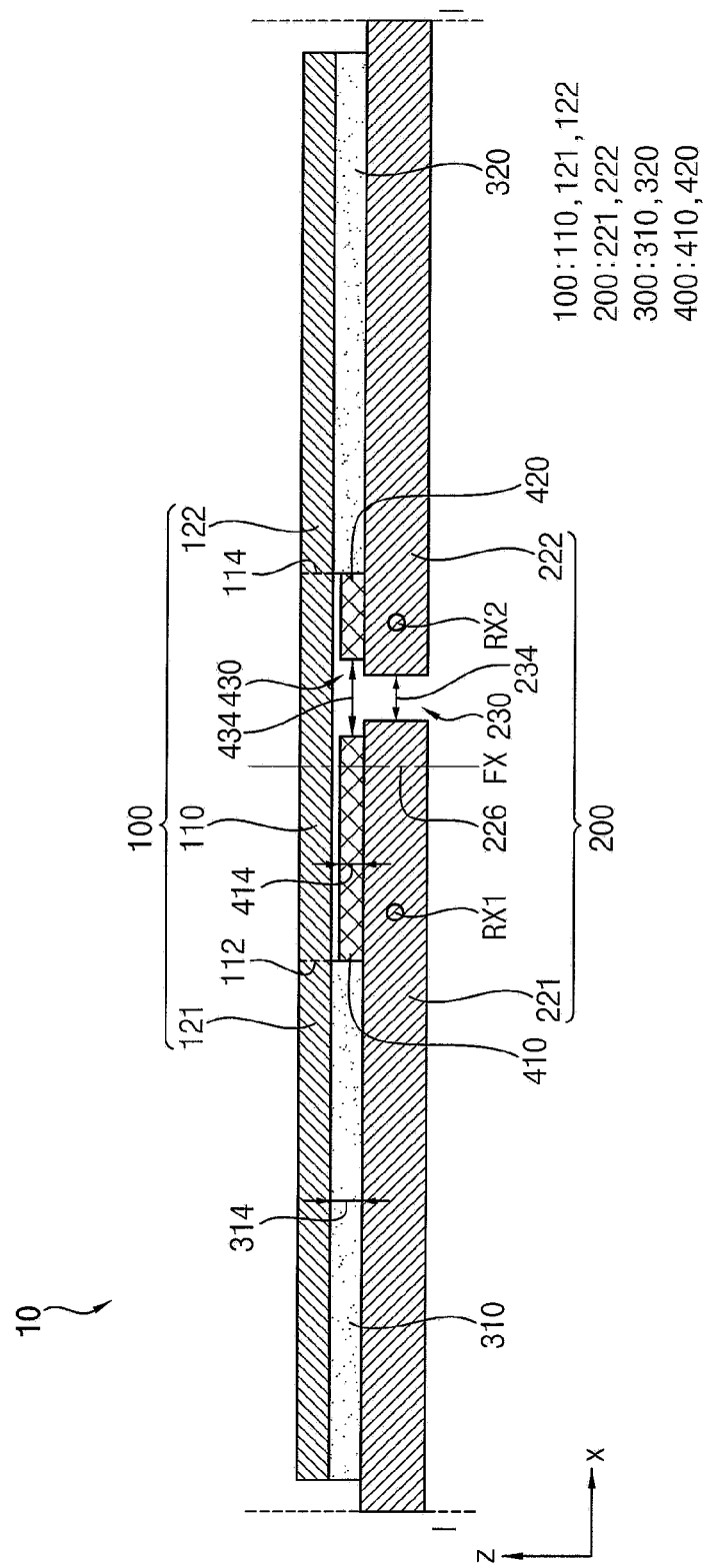
FIG. 3 is a cross-sectional view taken along a line I-I' of FIG. 2.

FIG. 1 is an elevational view of an exemplary embodiment of a foldable display device constructed according to principles of the invention. FIG. 2 is a plan view illustrating the foldable display device of FIG. 1. FIG. 3 is a cross-sectional view taken along a line I-I' of FIG. 2.

Referring to FIGS. 1, 2, and 3, the foldable display device 10 according to an exemplary embodiment may include a flexible display module 100, a support which may be in the form of a case 200, an adhesive member 300, and a spacer, which may be in the form of a step difference compensation member 400.

The flexible display module 100 may have a first surface 101 and a second surface 102 opposite to each other in the thickness direction (e.g., a Z axis direction) of the flexible display module 100. The flexible display module 100 may display an image toward the first surface 101, i.e., the Z axis direction. The flexible display module 100 may include polymer material, therefore, the flexible display module 100 may have flexible characteristics.

Figure 4:
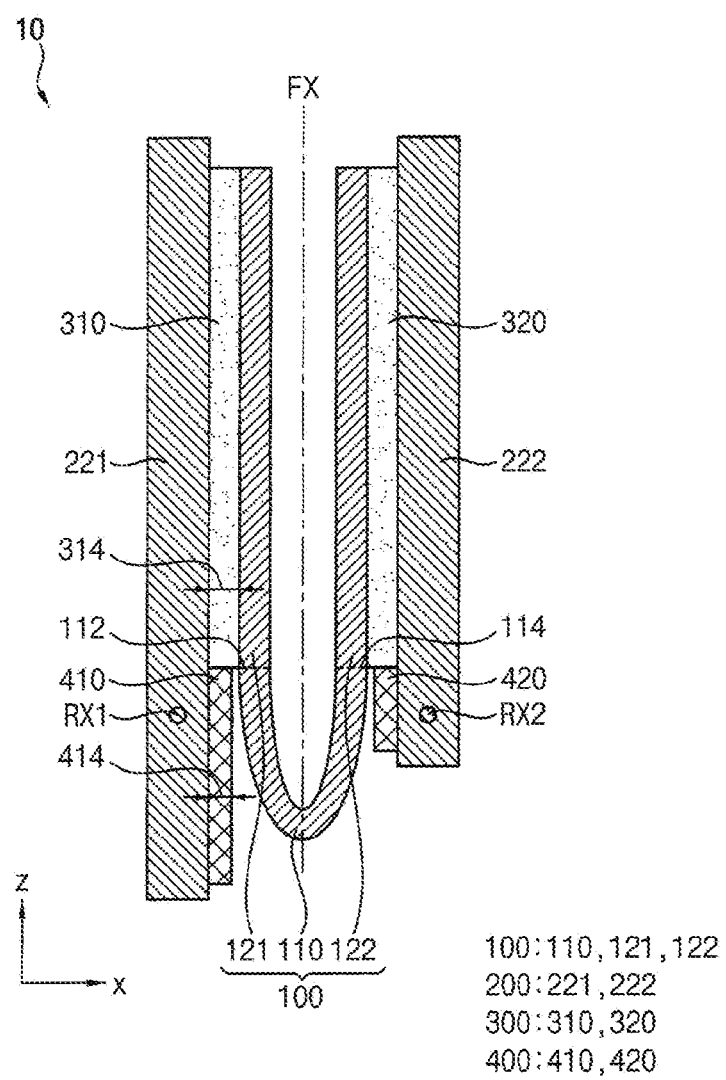
FIG. 4 is a cross-sectional view illustrating a folded position of the foldable display device of FIG. 3.

The flexible display module 100 may include a bendable area 110, which may be bent when folded as shown in FIG. 4, and the substantially planar areas 121 and 122. The bendable area 110 may be bent along a folding axis FX. The folding axis FX may extend in a Y axis direction. The substantially planar areas 121 and 122 may be located at, respectively, opposite sides 112 and 114 of the bendable area 110. The substantially planar areas 121 and 122 may include a first substantially planar area 121 and a second substantially planar area 122. When unfolded, the first substantially planar area 121 may be located in a −X axis direction from the bendable area 110, and the second substantially planar area 122 may be located in an opposite X axis direction with respect to the first substantially planar area 121 from the bendable area 110.

The case 200 may be disposed on the flexible display module 100. The case 200 may be disposed on the second surface 102 of the flexible display module 100. The case 200 may support the flexible display module 100, and may maintain the shape of the flexible display module 100. The case 200 may maintain the substantially planar shape of the flexible display module 100 when the foldable display device 10 is unfolded, and the case 200 may maintain a folded shape of the flexible display module 100 when the foldable display device 10 is folded.

The case 200 may include a hinge portion 210 and supporting portions 221 and 222, which may provide for the elements disposed above them when the foldable display device 10 is unfolded as shown in FIG. 1. The supporting portions 221 and 222 may be rotatably coupled, respectively, at opposite sides 212 and 214 of the hinge portion 210. The supporting portions 221 and 222 may include a first supporting portion 221 and a second supporting portion 222. The first supporting portion 221 and the second supporting portion 222 may support, respectively, the first substantially planar area 121 and the second substantially planar area 122 and may be spaced apart from each other by a space 230 therebetween. The first supporting portion 221 and the second supporting portion 222 may be rotated with respect to the hinge portion 210, so that the foldable display device 10 may be folded and unfolded.

The hinge portion 210 may have a single axis hinge structure or a double axes hinge structure. The hinge portion 210 having the single axis hinge structure may have one rotating axis, and the supporting portions 221 and 222 may rotate about one rotating axis. The hinge portion 210 having the double axes hinge structure may have two rotating axes, and the supporting portions 221 and 222 may be rotatable about two rotating axes. FIGS. 1 to 3 illustrate the hinge portion 210 having the double axes hinge structure. In this case, the hinge portion 210 may have a first rotating axis RX1 and a second rotating axis RX2, and the first supporting portion 221 and the second supporting portion 222 may be rotated, respectively, about the first rotating axis RX1 and the second rotating axis RX2. The space 230 between the supporting portions 221 and 222 may be located between the rotating axes RX1 and RX2 in a plan view.

The adhesive member 300 may be disposed between the flexible display module 100 and the case 200. The adhesive member 300 may connect the substantially planar areas 121 and 122 of the flexible display module 100 and the supporting portions 221 and 222 of the case 200. The adhesive member 300 may include an acrylic resin, a silicon based resin, or the like. The substantially planar areas 121 and 122 of the flexible display module 100 may be coupled at the supporting portions 221 and 222 of the case 200 by the adhesive member 300, so that the flexible display module 100 may be folded or unfolded when the supporting portions 221 and 222 of the case 200 are rotated.

The adhesive member 300 may include a first adhesive member 310 and a second adhesive member 320. The first adhesive member 310 may be disposed between the first substantially planar area 121 of the flexible display module 100 and the first supporting portion 221 of the case 200, and the second adhesive member 320 may be disposed between the second substantially planar area 122 of the flexible display module 100 and the second supporting portion 222 of the case 200.

The step difference compensation member 400 may be disposed between the flexible display module 100 and the case 200. The step difference compensation member 400 may be disposed in a space between the bendable area 110 of the flexible display module 100 and the supporting portions 221 and 222 of the case 200, which are spaced apart by the adhesive member 300. Accordingly, the step difference compensation member 400 may compensate for the difference in height by at least partially filling the space between the bendable area 110 of the flexible display module 100 and the supporting portions 221 and 222 of the case 200 to reduce a syncline (trough-like or concave) deformation, as described hereinafter.

The step difference compensation member 400 may include a first step difference compensation member 410 and a second step difference compensation member 420. The first step difference compensation member 410 may be disposed between the bendable area 110 of the flexible display module 100 and the first supporting portion 221 of the case 200, and the second step difference compensation member 420 may be disposed between the bendable area 110 of the flexible display module 100 and the second supporting portion 222 of the case 200.

The first step difference compensation member 410 and the second step difference compensation member 420 may be spaced apart from each other with a space 430 therebetween. In an embodiment, the width 434 of the space 430 between the step difference compensation members 410 and 420 may be greater than the width 234 of the space 230 between the supporting portions 221 and 222. For example, the width 234 in the X axis direction of the space 230 between the step difference compensation members 410 and 420 may be greater than the width in the X axis direction of the space 230 between the supporting portions 221 and 222.

The thickness 414 of the step difference compensation member 400 may be less than or substantially equal to the thickness 314 of the adhesive member 300. For example, the thickness 414 in the Z axis direction of the first step difference compensation member 410 may be less than or substantially equal to the thickness 314 in the Z axis direction of the first adhesive member 310, and the thickness in the Z axis direction of the second step difference compensation member 420 may be less than or substantially equal to the thickness in the Z axis direction of the second adhesive member 320. In some exemplary embodiments, the thickness 414 of the first step difference compensation member 410 is substantially the same as the thickness of the second step difference compensation member 420 and the thickness 314 of the first adhesive member 310 is substantially the same as the thickness of the second adhesive member 320. As such, the thickness of the step difference compensation member 400 may be designed in reference to the thickness 414 of the first step difference compensation member 410 and the thickness of the adhesive member 300 may be designed in reference to the thickness 314 of the first adhesive member 310.

In exemplary embodiments of the invention, at least a portion 226 of the folding axis FX overlaps at least one of the supporting portions 221 and 222 in a plan view. In other words, at least a portion 226 of the folding axis FX does not overlap the space 230 between the supporting portions 221 and 222 in a plan view.

In an exemplary embodiment, the space 230 between the supporting portions 221 and 222 may be generally parallel to and non-overlapping the folding axis FX. For example, the space 230 between the supporting portions 221 and 222 may be located in the X axis direction from the folding axis FX, and may extend in the Y axis direction. In such an exemplary embodiment, the area of the first supporting portion 221 may be different from the area of the second supporting portion 222, or the width in the X axis direction of the first supporting portion 221 may be different from the width in the X axis direction of the second supporting portion 222. For example, the area of the first supporting portion 221 may be greater than the area of the second supporting portion 222, and the width in the X axis direction of the first supporting portion 221 may be greater than the width in the X axis direction of the second supporting portion 222.

FIG. 4 is a cross-sectional view illustrating a folded position of the foldable display device of FIG. 3.

Referring to FIGS. 2 to 4, the foldable display device 10 may be folded or unfolded. The supporting portions 221 and 222 of the case 200 may be rotated with respect to the rotating axes RX1 and RX2 of the hinge portion 210, respectively, so that the bendable area 110 of the flexible display module 100 may be bent or unbent with respect to the folding axis FX.

The rotating axes RX1 and RX2 may be symmetric with respect to the folding axis FX in a plan view. For example, the rotating axes RX1 and RX2 may be generally parallel to the folding axis FX, and the distance in the X direction between the first rotating axis RX1 and the folding axis FX in a plan view may be substantially equal to the distance in the X direction between the second rotating axis RX2 and the folding axis FX in a plan view.

Figure 5:
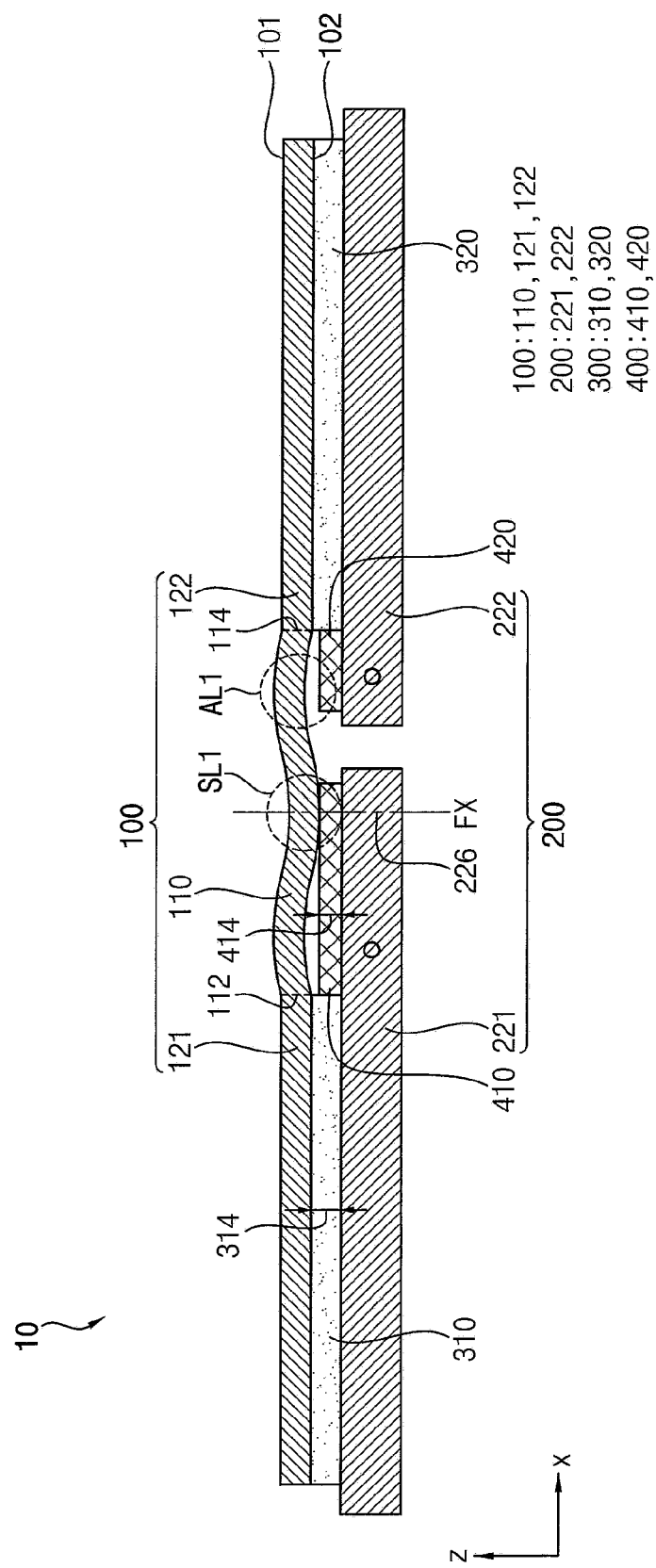
FIG. 5 is a cross-sectional view illustrating the foldable display device of FIG. 3 in an unfolded position after being folded and unfolded a plurality of times.

FIG. 5 is a cross-sectional view illustrating the foldable display device of FIG. 3 in an unfolded position after being folded and unfolded a plurality of times.

Referring to FIG. 5, when the foldable display device 10 is folded and unfolded a plurality of times, wrinkle deformation may be formed in the bendable area 110 of the flexible display module 100. In this case, a portion SL1 of the bendable area 110 overlapping the folding axis FX may have a syncline (concave) structure protruding to the −Z axis direction, and a portion AL1 of the bendable area 110 located between the folding axis FX and the substantially planar area 121 and 122 may have an anticline (convex) structure protruding to the Z axis direction such that the bendable area 110 has a generally undulating overall shape. The wrinkle deformation of the bendable area 110 may be caused by residual deformation due to creep of the polymer material included in the flexible display module 100.

In the foldable display device 10 according to the illustrated exemplary embodiment of the invention, at least a portion 226 of the folding axis FX overlaps at least one of the supporting portions 221 and 222 in a plan view. In such an exemplary embodiment, at least a portion 226 of the folding axis FX does not overlap the space 230 between the supporting portions 221 and 222 in a plan view. Therefore, the supporting portions 221 and 222 of the case 200 or the step difference compensation member 410 and 420 may support the portion SL1 of the bendable area 110 which protrudes to the −Z axis direction and overlaps the folding axis FX when the device is in an unfolded position, such as illustrated in FIG. 5. Accordingly, the amount of the wrinkle deformation of the flexible display module 100 may be minimized.

Figure 6:
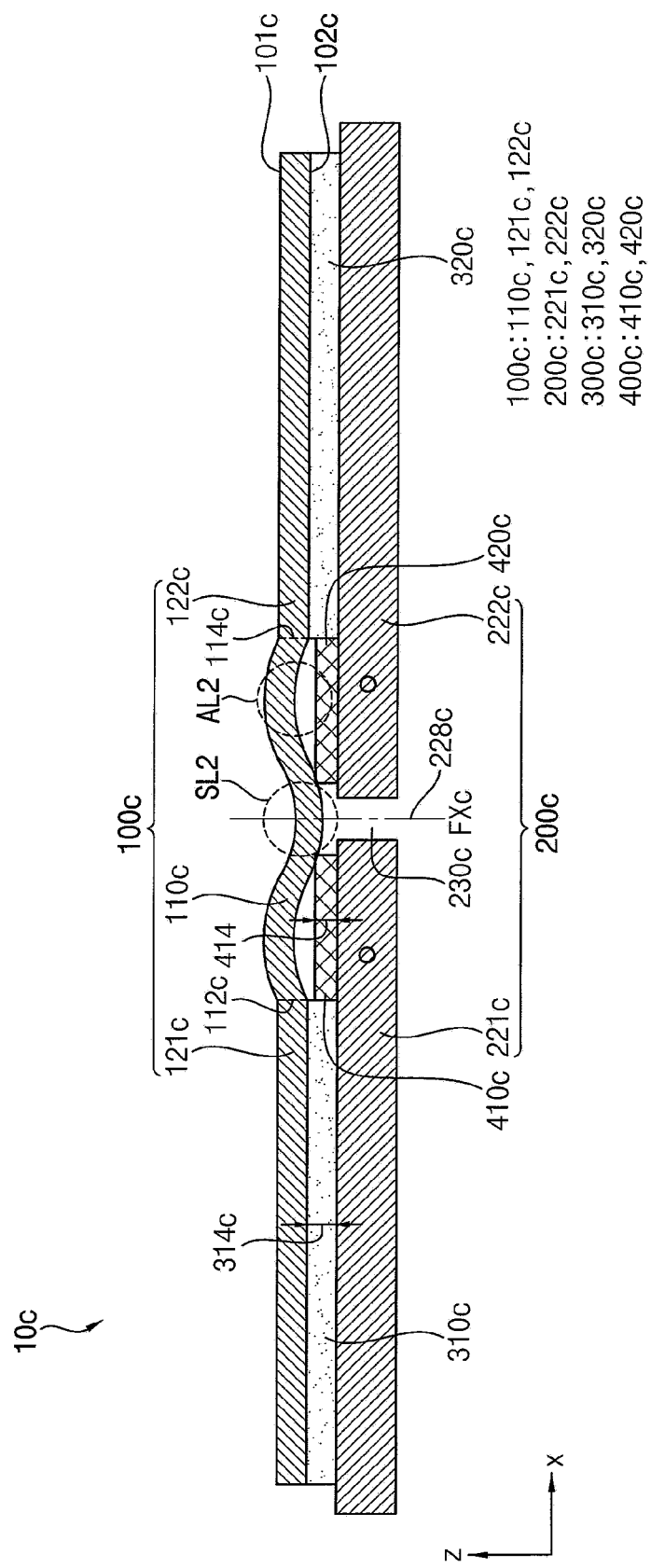
FIG. 6 is a cross-sectional view of a comparative example of a foldable display device in an unfolded position after being folded and unfolded a plurality of times.

FIG. 6 is a cross-sectional view of a comparative example of a foldable display device in an unfolded position after being folded and unfolded a plurality of times.

Referring to FIG. 6, in a foldable display device 10c according to a comparative example, an entire portion 228c of the folding axis FXc does not overlap the supporting portions 221c and 222c in a plan view. In other words, the entire portion 228c of the folding axis FXc overlaps the space 230c between the supporting portions 221c and 222c in a plan view. In this case, the supporting portions 221c and 222c may be symmetric with respect to the folding axis FXc in a plan view. Therefore, the supporting portions 221c and 222c of the case 200c or the step difference compensation member 410c and 420c do not support a portion SL2 of the bendable area 110c that protrudes to the −Z axis direction and overlaps the folding axis FXc as illustrated in FIG. 6. Accordingly, the amount of the wrinkle deformation of the flexible display module 100c is not constrained and is greater than that shown in FIG. 5. Further, the second surface 102c of the flexible display module 100c may contact a corner of the step difference compensation member 410c and 420c, so the flexible display module 100c may be damaged.

Figure 7:
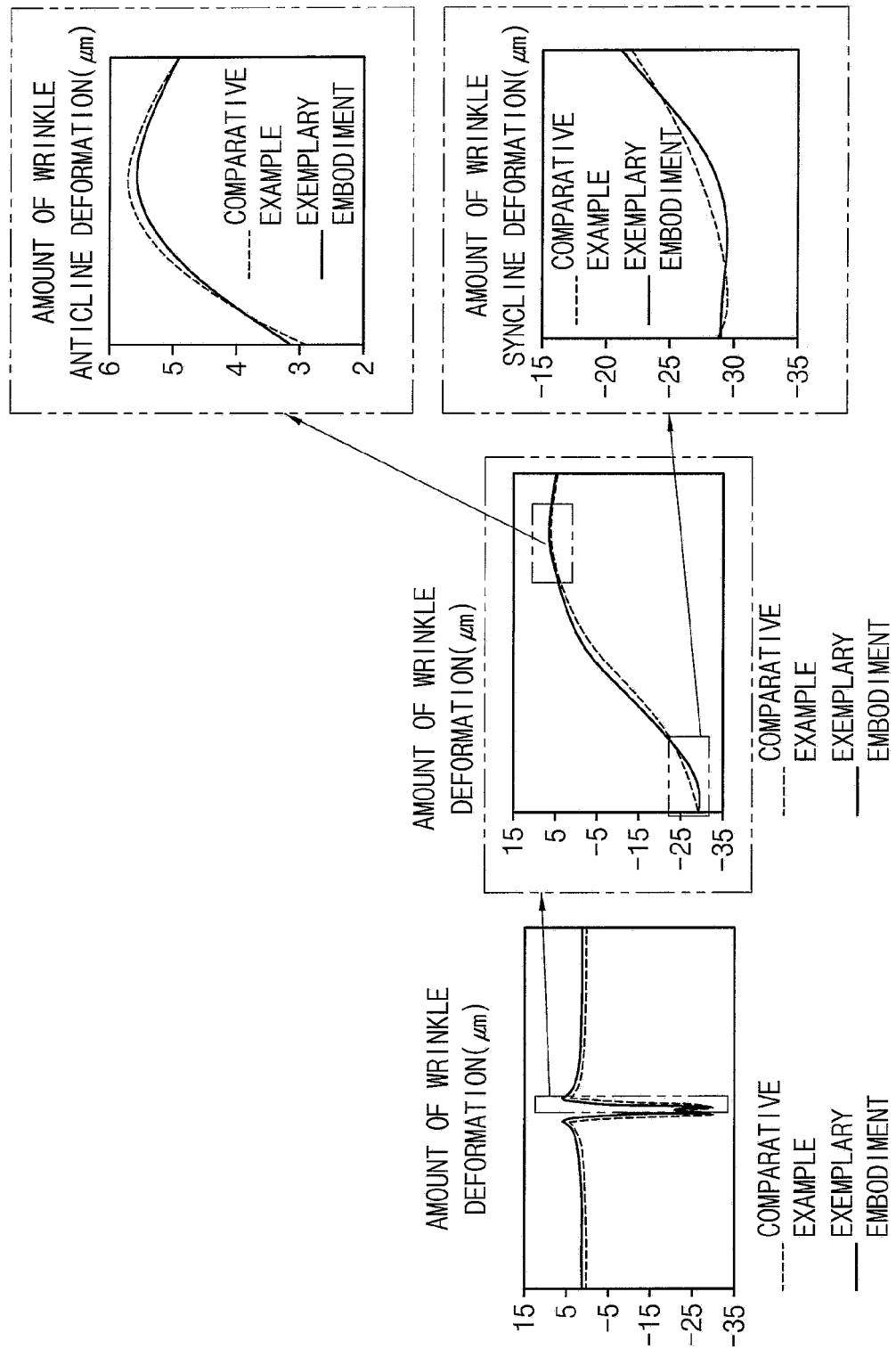
FIG. 7 is a graphical depiction illustrating the amount of wrinkle deformation of foldable display devices according to an exemplary embodiment and a comparative example.

FIG. 7 is a graphical depiction illustrating the amount of wrinkle deformation of foldable display devices according to an exemplary embodiment and a comparative example.

Referring to FIGS. 5 to 7, the amount of slope of the wrinkle deformation of the portion SL1 of the flexible display module 100 according to the exemplary embodiment having the syncline structure may be gentler (less) than the amount of slope of the wrinkle deformation of the portion SL2 of the flexible display module 100c according to the comparative example having the syncline structure. Accordingly, the visibility of the wrinkle deformation of the portion SL1 of the flexible display module 100 according to the exemplary embodiment having the syncline structure is less than that of the visibility of the wrinkle deformation of the portion SL2 of the flexible display module 100c according to the comparative example having the syncline structure. Further, the magnitude of the amount of the wrinkle deformation of the portion AL1 of the flexible display module 100 according to the exemplary embodiment having the anticline structure may be less than the magnitude of the amount of the wrinkle deformation of the portion AL2 of the flexible display module 100c according to the comparative example having the anticline structure. Accordingly, the visibility of the wrinkle deformation of the portion AL1 of the flexible display module 100 according to the exemplary embodiment having the anticline structure may be improved over the visibility of the wrinkle deformation of the portion AL2 of the flexible display module 100c according to the comparative example having the anticline structure.

Figure 8:
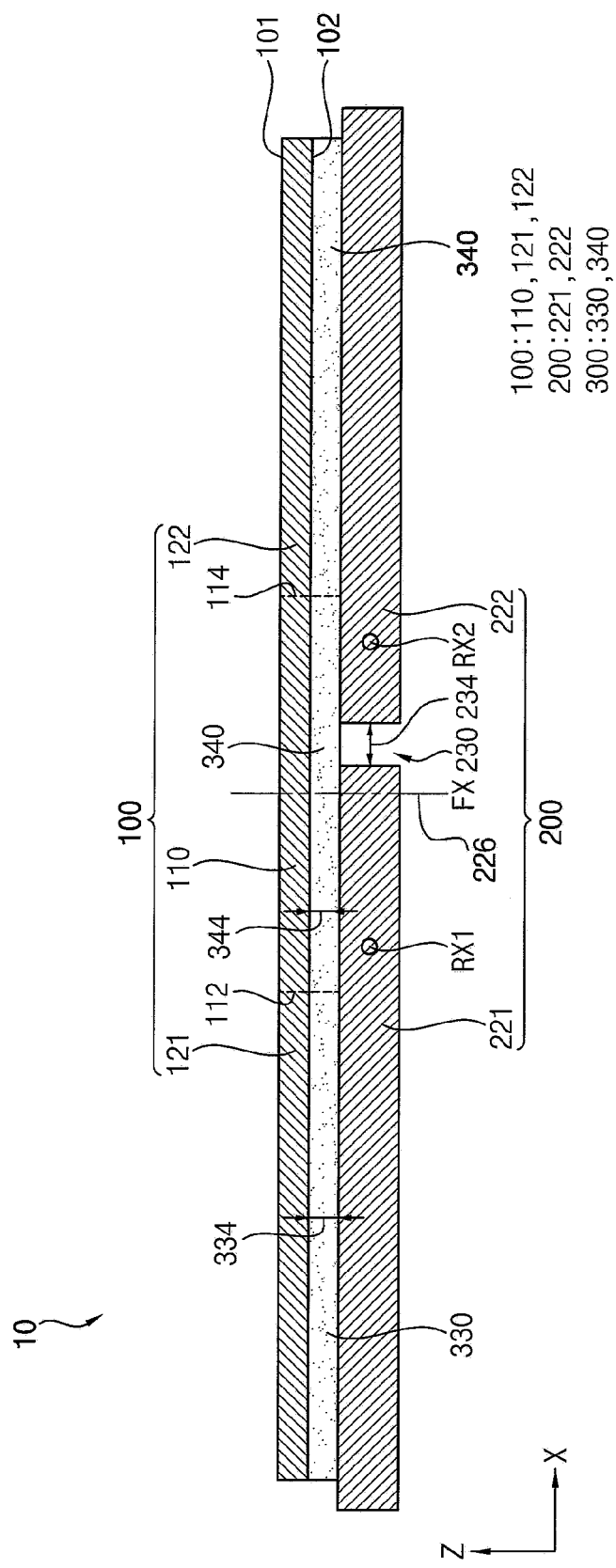
FIG. 8 is a cross-sectional view of another exemplary embodiment of a foldable display device constructed according to principles of the invention.

FIG. 8 is a cross-sectional view of another exemplary embodiment of a foldable display device constructed according to principles of the invention. Referring to FIG. 8, the foldable display device 10 according to an exemplary embodiment may include a flexible display module 100, a case 200, and an adhesive member 300. Descriptions of elements of the foldable display device 10 described with reference to FIG. 8, which are substantially the same as those of the foldable display device 10 described with reference to FIGS. 1 to 3, will not be repeated to avoid redundancy.

The adhesive member 300 may be disposed between the flexible display module 100 and the supporting portions 221 and 222 of the case 200. The adhesive member 300 may be attached to the second surface 102 of the flexible display module 100.

The adhesive member 300 may include an attached area 330 attached to the supporting portions 221 and 222 of the case 200 and a non-attached area 340 not attached to the supporting portions 221 and 222 of the case 200. The attached area 330 may overlap the substantially planar areas 121 and 122 of the flexible display module 100, and the non-attached area 340 may overlap the bendable area 110 of the flexible display module 100. By attaching the adhesive member 300 having adhesive force to the supporting portions 221 and 222 of the case 200, and then reducing the adhesive force of a portion of the adhesive member 300 through chemical or physical treatment, the non-attached area 340 that is not attached to the supporting portions 221 and 222 of the case 200 may be formed and permit folding. The non-attached area 340 may be located between the bendable area 110 of the flexible display module 100 and the supporting portions 221 and 222 of the case 200, so that the step difference compensation member 400 described with reference to FIGS. 1 to 3 may not be required.

Figure 9:
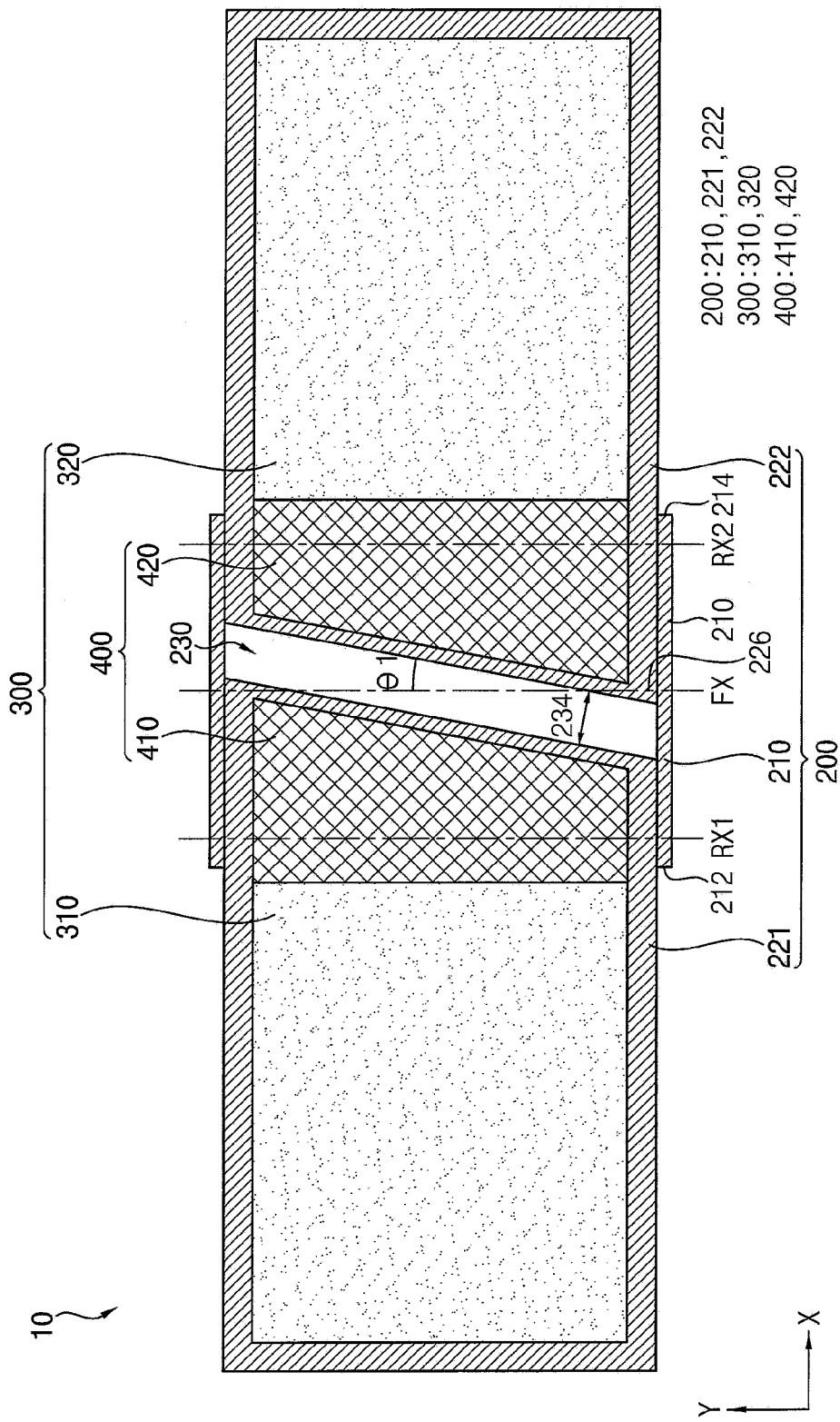
FIG. 9 is a plan view of another exemplary embodiment of a foldable display device constructed according to principles of the invention.

FIG. 9 is a plan view of another exemplary embodiment of a foldable display device constructed according to principles of the invention. Descriptions of elements of the foldable display device 10 described with reference to FIG. 9, which are substantially the same as those of the foldable display device 10 described with reference to FIGS. 1 to 3, will not be repeated, to avoid redundancy.

Referring to FIG. 9, the space 230 between the supporting portions 221 and 222 is at least partially overlapping and inclined to the folding axis FX in a plan view. For example, the space 230 between the supporting portions 221 and 222 overlaps a portion of the folding axis FX in a plan view, and extends with forming an angle θ1 with respect to the Y axis direction. Here, the angle θ1 between the space 230 and the folding axis FX may be greater than about 0 degree and less than about 90 degrees.

FIG. 10 is a plan view of yet another exemplary embodiment of a foldable display device constructed according to principles of the invention. Descriptions of elements of the foldable display device 10 described with reference to FIG. 10, which are substantially the same as those of the foldable display device 10 described with reference to FIGS. 1 to 3, will not be repeated to avoid redundancy.

Referring to FIG. 10, the space 230 between the supporting portions 221 and 222 does not overlap and is inclined to the folding axis FX in a plan view. For example, the space 230 between the supporting portions 221 and 222 is located in the X axis direction from the folding axis FX, and extends with forming an angle θ2 with respect to the Y axis direction. Here, the angle θ2 between the space 230 and the folding axis FX may be greater than about 0 degree and less than about 90 degrees.

FIGS. 11A, 11B, 11C, and 11D are plan views of other exemplary embodiments of foldable display devices constructed according to principles of the invention. Descriptions of elements of the foldable display device 10 described with reference to FIGS. 11A to 11D, which are substantially the same as those of the foldable display device 10 described with reference to FIGS. 1 to 3, will not be repeated to avoid redundancy.

Referring to FIGS. 11A to 11D, the space 230 between the supporting portions 221 and 222 has a generally zigzag shape 236 in a plan view. For example, the space 230 between the supporting portions 221 and 222 extends in the Y axis direction while having the generally zigzag shape 236. Accordingly, the space 230 between the supporting portions 221 and 222 has bendable portions that are repeatedly bent at regular intervals.

Figure 11A:
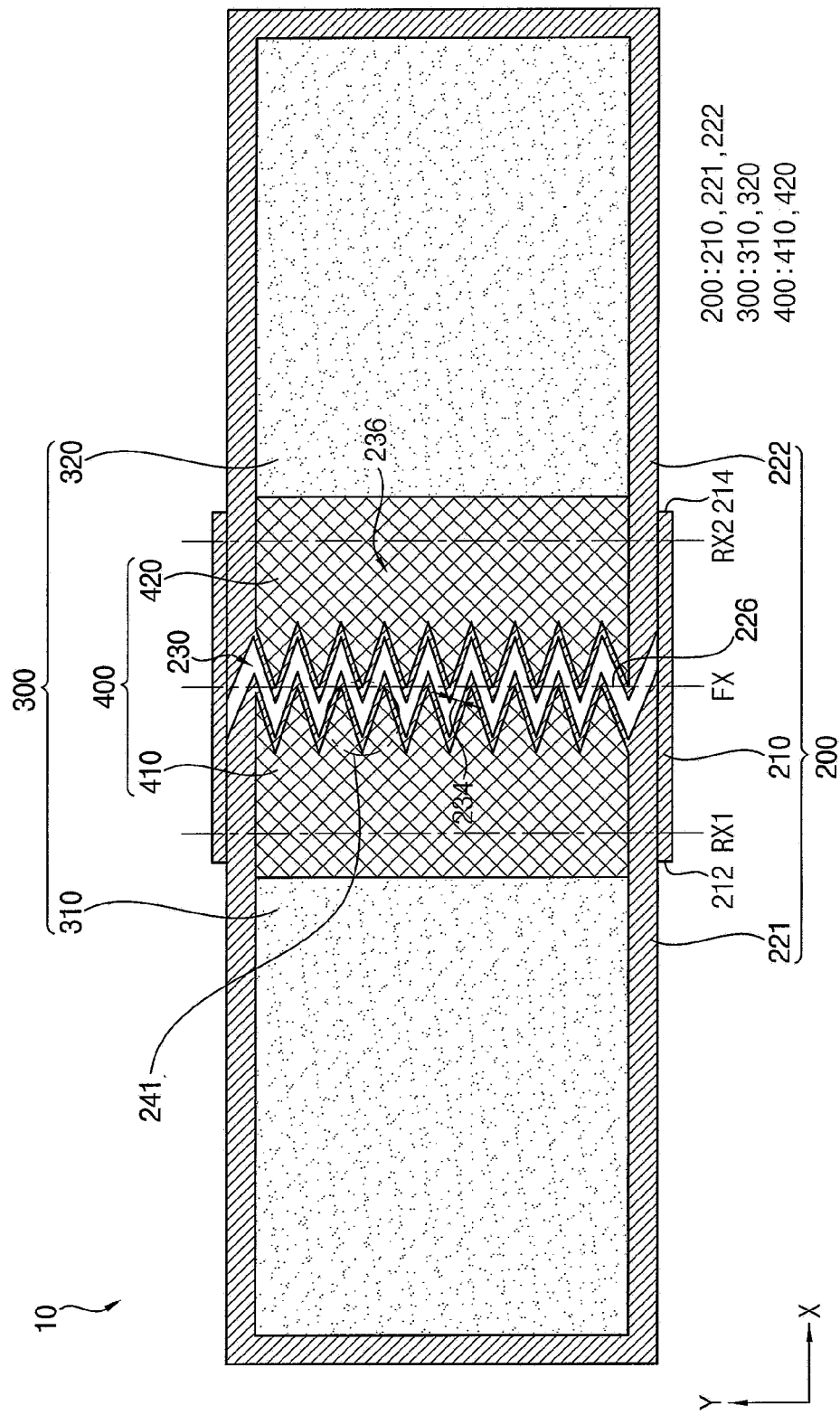

Referring to FIGS. 11A to 11C, in exemplary embodiments, the bent portions 241, 242, and 243 of the space 230 between the supporting portions 221 and 222 having the generally zigzag shape 236 may be angled. In such exemplary embodiments, the bent portions 241, 242, and 243 of the space 230 between the supporting portions 221 and 222 may have an acute angle shape, a right-angle shape, or an obtuse angle shape.

In an exemplary embodiment, the bent portion 241 of the space 230 between the supporting portions 221 and 222 may have the acute angle shape as illustrated in FIG. 11A. For example, ends of the supporting portions 221 and 222 spaced apart from each other with the space 230 therebetween may have generally sawtooth shapes that mesh with each other. In another exemplary embodiment, the bent portion 242 of the space 230 between the supporting portions 221 and 222 may have a right-angle shape as illustrated in FIG. 11B. For example, the ends of the supporting portions 221 and 222 spaced apart from each other with the space 230 therebetween may have generally rectangular concavo-convex shapes that mesh with each other. In still another exemplary embodiment, the bent portion 243 of the space 230 between the supporting portions 221 and 222 may have the obtuse angle shape as illustrated in FIG. 11C. For example, the ends of the supporting portions 221 and 222 spaced apart from each other with the space 230 therebetween may have generally trapezoid concavo-convex shapes that mesh with each other.

Referring to FIG. 11D, in other exemplary embodiments, the bent portion 244 of the space 230 between the supporting portions 221 and 222 having the generally zigzag shape 236 may be generally curved. For example, ends of the supporting portions 221 and 222 spaced apart from each other with the space 230 therebetween may have wavy shapes that mesh with each other.

Figure 12:
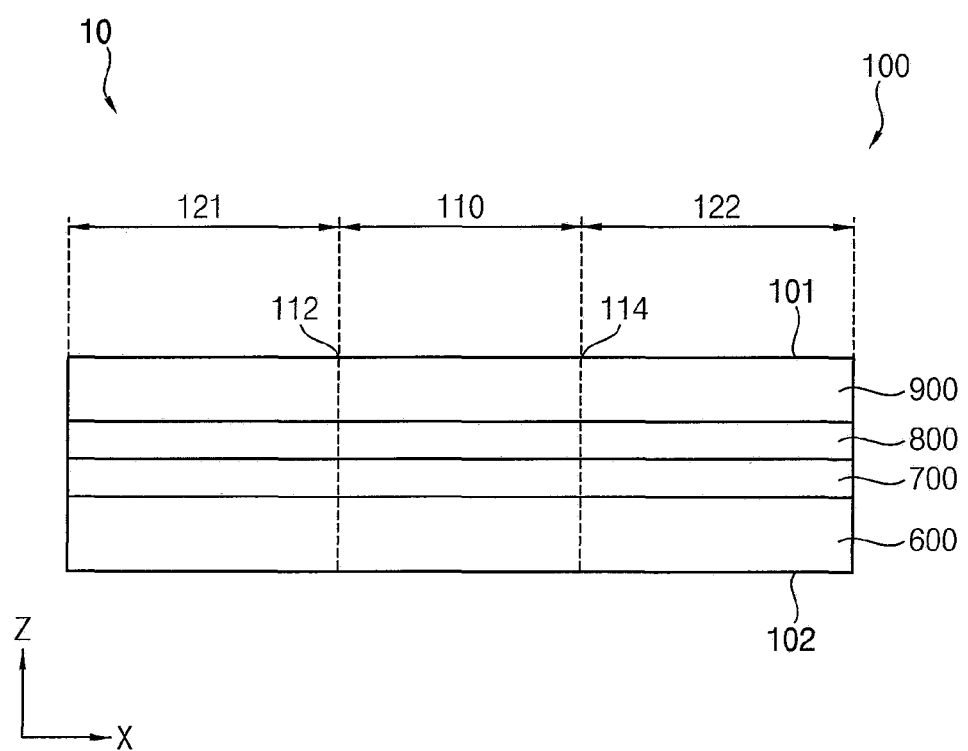
FIG. 12 is a cross-sectional view of an exemplary embodiment illustrating the flexible display module of the foldable display device of FIG. 1.

FIG. 12 is a cross-sectional view of an exemplary embodiment illustrating a flexible display module of the foldable display device of FIG. 1.

Referring to FIG. 12, the flexible display module 100 may include a display panel 600, a sensing layer 700, a polarizing layer 800, and a window 900. As described above, because the flexible display module 100 may be outwardly or inwardly folded, the display panel 600, the sensing layer 700, the polarizing layer 800, and the window 900 may have flexible characteristics.

The display panel 600 may include a plurality of pixels, and may generate an image formed by light emitted from each of the pixels. The display panel 600 may include a first surface and a second surface opposite to each other. For example, the first surface of the display panel 600 may be toward the Z axis direction, and the second surface of the display panel 600 may be toward, the opposite, the −Z axis direction. The display panel 600 may display an image to the first surface, and the second surface of the display panel 600 may be the non-display surface 102 of the flexible display module 100.

The sensing layer 700 may be disposed on the display panel 600. The sensing layer 700 may sense an external input such as an external object contacting or approaching the sensing layer 700. For example, the sensing layer 700 may sense the external input with a static capacitive method.

The polarizing layer 800 may be disposed on the sensing layer 700. The polarizing layer 800 may reduce reflection of external light of the foldable display device 10. For example, when the external light having passed through the polarizing layer 800 is reflected from below the polarizing layer 800 (e.g., the display panel 600) and then passes through the polarizing layer 800 again, a phase of the reflected external light may be changed as the incoming external light passes through the polarizing layer 800 twice. As a result, a phase of reflected external light may be different from the phase of the incoming external light entering the polarizing layer 800 to the extent that a destructive interference occurs. Accordingly, the reflection of external light may be reduced to increase visibility of the foldable display device 10.

The window 900 may be disposed on the polarizing layer 800. The window 900 may protect the display panel 600, the sensing layer 700, and the polarizing layer 800 from external impact, and may provide the display surface 101 of the flexible display module 100. In an exemplary embodiment, the window 900 may include a glass, a polymer resin such as a polycarbonate (PC), a polymethyl methacrylate (PMMA), a polyarylate (PAR), a polyethersulfone (PES), a polyethylene terephthalate (PET), a polyethylene naphthalate (PEN), etc., or the like.

Figure 13:
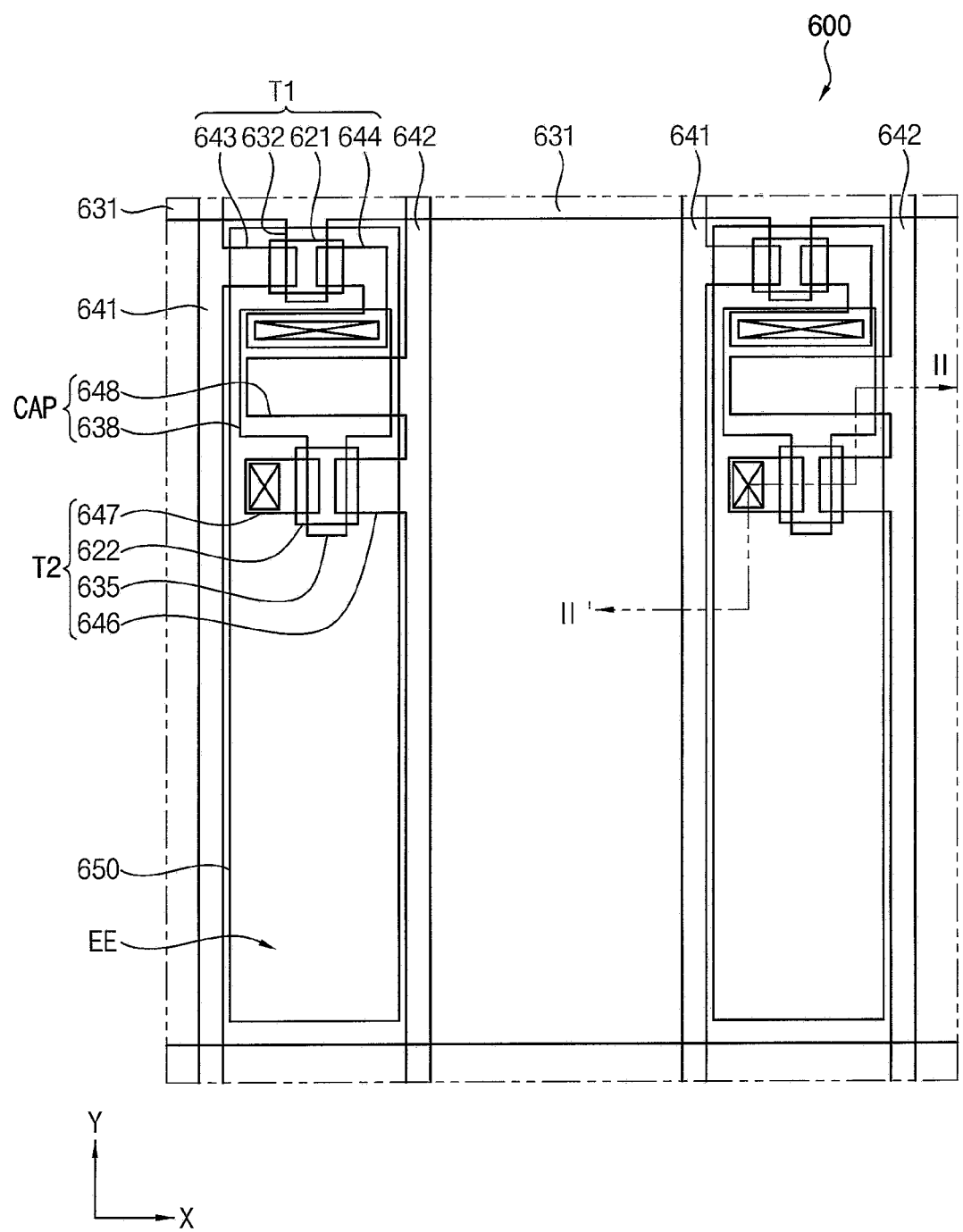
FIG. 13 is a plan view illustrating an exemplary embodiment of the display panel of the flexible display module of FIG. 12.
Figure 14:
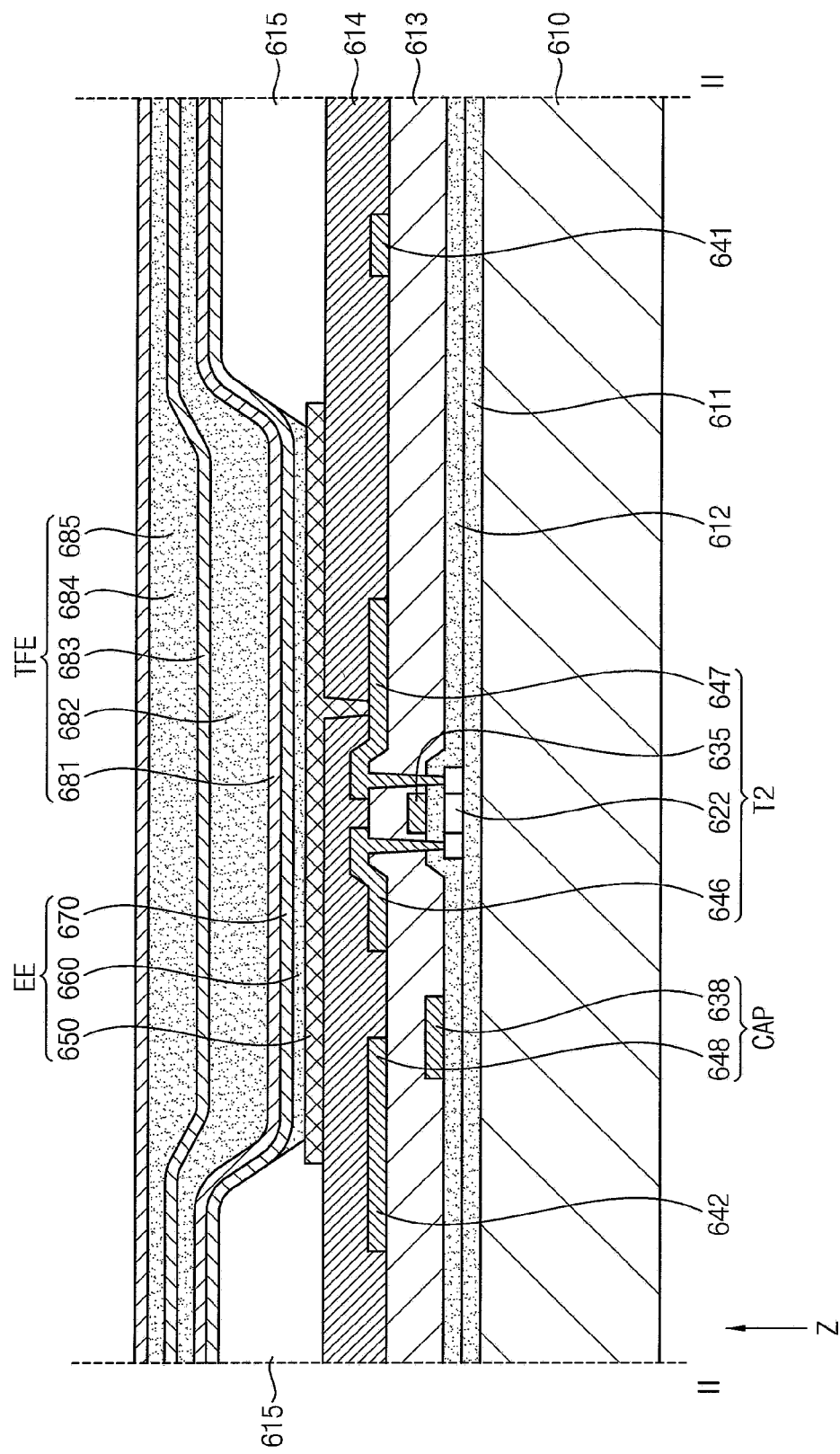
FIG. 14 is a cross-sectional view taken along a line II-II' of FIG. 13.

FIG. 13 is a plan view illustrating an exemplary embodiment of a display panel of the flexible display module of FIG. 12. FIG. 14 is a cross-sectional view taken along a line II-II' of FIG. 13.

Referring to FIGS. 13 and 14, the display panel 600 includes a plurality of pixels, each of the pixels including a switching thin film transistor (TFT) T1, a driving TFT T2, a capacitor CAP, and a light emitting element EE. As used herein, the term "pixel" refers to a smallest unit for displaying an image, and the display panel 600 may display an image using the plurality of pixels.

Although FIGS. 13 and 14 illustrate each of the pixels includes two TFTs and one capacitor, the exemplary embodiments are not limited thereto. In another exemplary embodiment, each of the pixels may include three or more TFTs and two or more capacitors.

The display panel 600 may include a substrate 610, a gate line 631 on the substrate 610, a data line 641 and a common power line 642 insulated from and intersecting the gate line 631. In general, each of the pixels may be defined by the gate line 631, the data line 641, and the common power line 642 as the boundary, however, the definition of the representative pixel is not limited thereto. The pixels may be defined by a pixel defining layer or a black matrix.

The substrate 610 may include a flexible material such as plastic or the like. For example, the substrate 610 may include a polyethersulfone (PES), a polycarbonate (PC), a polyimide (PI), a polyethylene terephthalate (PET), a polyethylene naphthalate (PEN), a polyacrylate (PAR), a fiber reinforced plastic (FRP), or the like.

The substrate 610 may have a thickness in a range from about 5 μm to about 200 μm. When the substrate 610 has a thickness of less than about 5 μm, it is difficult for the substrate 610 to stably support the light emitting element EE. When the substrate 610 has a thickness of greater than about 200 μm, the flexible characteristics of the substrate 610 may be degraded.

A buffer layer 611 may be disposed on the substrate 610. The buffer layer 611 may prevent or reduce permeation of impurities and planarize a surface therebelow. The buffer layer 611 may include a silicon nitride, a silicon oxide, a silicon oxynitride, or the like. However, the buffer layer 611 may be omitted based on the kinds of the substrate 610 and process conditions thereof.

A switching semiconductor layer 621 and a driving semiconductor layer 622 may be disposed on the buffer layer 611. The switching semiconductor layer 621 and the driving semiconductor layer 622 may be formed of a polycrystalline silicon, an amorphous silicon, and/or an oxide semiconductor including, for example, an indium gallium zinc oxide (IGZO) and/or an indium zinc tin oxide (IZTO). For example, when the driving semiconductor layer 622 is formed of the polycrystalline silicon, the driving semiconductor layer 622 may include a channel region that is not doped with impurities and doped source and drain regions that are formed on opposite sides of the channel region. In such an exemplary embodiment, p-type impurities, such as boron (B), may be used as dopant ions and diborane ($B_2H_6$) is often used. Such impurities may vary depending on the kinds of TFTs. The driving TFT T2, according to exemplary embodiments, is a p-channel metal oxide semiconductor (PMOS) TFT including p-type impurities, however, the driving TFT T2 is not limited thereto. In another exemplary embodiment, the driving TFT T2 may be an n-channel metal oxide semiconductor (NMOS) TFT or a complementary metal oxide semiconductor (CMOS) TFT.

A gate insulation layer 612 may be disposed on the switching semiconductor layer 621 and the driving semiconductor layer 622. The gate insulation layer 612 may include a tetraethyl orthosilicate (TEOS), a silicon nitride, and/or a silicon oxide. In an exemplary embodiment, the gate insulation layer 612 may have a double-layer structure in which a silicon nitride layer having a thickness of about 40 nm and a TEOS layer having a thickness of about 80 nm are sequentially stacked.

A gate wiring including gate electrodes 632 and 635 may be disposed on the gate insulation layer 612. The gate wiring may further include the gate line 631, a first capacitor plate 638, or the like. The gate electrodes 632 and 635 may be disposed to overlap at least a portion of the semiconductor layers 621 and 622, for example, the channel region thereof. The gate electrodes 632 and 635 may serve to substantially prevent the channel region from being doped with impurities when source and drain regions of the semiconductor layers 621 and 622 are doped with impurities during the process of forming the semiconductor layers 621 and 622.

The gate electrodes 632 and 635 and the first capacitor plate 638 may be disposed on the same or substantially similar layer and include the same or substantially similar metal material. For example, the gate electrodes 632 and 635 and the first capacitor plate 638 may be formed of molybdenum (Mo), chromium (Cr), and/or tungsten (W).

An insulation interlayer 613 covering the gate electrodes 632 and 635 may be disposed on the gate insulation layer 612. The insulation interlayer 613, similar to the gate insulation layer 612, may include or may be formed of a silicon nitride, a silicon oxide, a tetraethyl orthosilicate, or the like, however, the material of the insulation interlayer 613 is not limited thereto.

A data wiring including source electrodes 643 and 646 and drain electrodes 644 and 647 may be disposed on the insulation interlayer 613. The data wiring may further include the data line 641, the common power line 642, a second capacitor plate 648, or the like. The source electrodes 643 and 646 and the drain electrodes 644 and 647 may be connected to a source region and a drain region of the semiconductor layers 621 and 622, respectively, through a contact hole defined in the gate insulation layer 612 and the insulation interlayer 613.

The switching TFT T1 may include the switching semiconductor layer 621, the switching gate electrode 632, the switching source electrode 643, and the switching drain electrode 644, and the driving TFT T2 may include the driving semiconductor layer 622, the driving gate electrode 635, the driving source electrode 646, and the driving drain electrode 647. The capacitor CAP may include the first capacitor plate 638 and the second capacitor plate 648 with the insulation interlayer 613 interposed therebetween.

The switching TFT T1 may function as a switching element to select pixels to perform light emission. The switching gate electrode 632 may be connected to the gate line 631. The switching source electrode 643 may be connected to the data line 641. The switching drain electrode 644 may be spaced apart from the switching source electrode 643 and connected to the first capacitor plate 638.

The driving TFT T2 may apply driving power to a pixel electrode 650, which allows an emission layer 660 of the light emitting element EE in the selected pixel to emit light.

The driving gate electrode 635 may be connected to the first capacitor plate 638. Each of the driving source electrode 646 and the second capacitor plate 648 may be connected to the common power line 642. The driving drain electrode 647 may be connected to the pixel electrode 650 of the light emitting element EE through a contact hole.

With the aforementioned structure, the switching TFT T1 may be driven by a gate voltage applied to the gate line 631 and may transmit data voltage applied to the data line 641 to the driving TFT T2. A voltage equivalent to a difference between a common voltage applied to the driving TFT T2 from the common power line 642 and the data voltage transmitted from the switching TFT T1 may be stored in the capacitor CAP, and a current corresponding to the voltage stored in the capacitor CAP may flow to the light emitting element EE through the driving TFT T2, such that the light emitting element EE may emit light.

A planarization layer 614 may be disposed to cover the data wiring (e.g., the data line 641, the common power line 642, the source electrodes 643 and 646, the drain electrodes 644 and 647, and the second capacitor plate 648, which are patterned into a substantially same layer on the insulation interlayer 613.

The planarization layer 614 may substantially eliminate a step difference and planarize a surface so as to increase luminance efficiency of the light emitting element EE formed thereon. The planarization layer 614 may include a polyacrylate resin, an epoxy resin, a phenolic resin, a polyamide resin, a polyimide resin, an unsaturated polyester resin, a polyphenylene ether resin, a polyphenylene sulfide resin, and/or a benzocyclobutene (BCB).

The pixel electrode 650 of the light emitting element EE may be disposed on the planarization layer 614. The pixel electrode 650 may be connected to the drain electrode 647 through a contact hole defined in the planarization layer 614.

A pixel defining layer 615 exposing at least a portion of the pixel electrode 650 to define a pixel area may be disposed on the planarization layer 614. The pixel electrode 650 may be disposed corresponding to the pixel area of the pixel defining layer 615. The pixel defining layer 615 may include a resin, such as a polyacrylate resin and/or a polyimide resin.

In the pixel area, the emission layer 660 may be disposed on the pixel electrode 650, and a common electrode 670 may be disposed on the pixel defining layer 615 and the emission layer 660. The emission layer 660 may include a low molecular weight organic material or a high molecular weight organic material. A hole injection layer HIL and/or a hole transporting layer HTL may also be disposed between the pixel electrode 650 and the emission layer 660, and an electron transporting layer ETL and/or an electron injection layer EIL may be further disposed between the emission layer 660 and the common electrode 670.

Each of the pixel electrode 650 and the common electrode 670 may be formed as a transmissive electrode, a transflective electrode, or a reflective electrode.

A transparent conductive oxide (TCO) may be used to form the transmissive electrode. The TCO may include an indium tin oxide (ITO), an indium zinc oxide (IZO), a zinc oxide (ZnO), and/or an indium oxide ($In_2O_3$).

A metal, such as magnesium (Mg), silver (Ag), gold (Au), calcium (Ca), lithium (Li), chromium (Cr), aluminum (Al), and copper (Cu), or an alloy thereof, may be used to form the transflective electrode and the reflective electrode. In such an exemplary embodiment, whether an electrode is a transflective type or a reflective type may depend on the thickness of the electrode. The transflective electrode may have a thickness of about 200 nm or less, and the reflective electrode may have a thickness of about 300 nm or more. As the thickness of the transflective electrode decreases, light transmittance and resistance increase. As the thickness of the transflective electrode increases, light transmittance decreases. In addition, the transflective electrode and the reflective electrode may have a multilayer structure which includes a metal layer including a metal or a metal alloy and a TCO layer stacked on the metal layer.

A thin film encapsulation layer TFE may be disposed on the common electrode 670. The thin film encapsulation layer TFE may include inorganic layers 681, 683, and 685 and organic layers 682 and 684. Further, the thin film encapsulation layer TFE may have a structure in which the inorganic layers 681, 683, and 685 and the organic layers 682 and 684 are alternately stacked. In such an exemplary embodiment, the inorganic layer 681 may be disposed at a lowermost portion or position. For example, the inorganic layer 681 may be disposed most adjacent to (e.g., nearest to or directly on) the light emitting element EE.

FIG. 14 illustrates that the thin film encapsulation layer TFE includes three inorganic layers 681, 683, and 685 and two organic layers 682 and 684. However, the exemplary embodiments are not limited thereto.

The inorganic layers 681, 683, and 685 may include one or more inorganic materials including $Al_2O_3$, $TiO_2$, $ZrO$, $SiN_x$, $SiO_2$, $AlON$, $AlN$, $SiON$, $Si_3N_4$, $ZnO$, and/or $Ta_2O_5$. The inorganic layers 681, 683, and 685 may be formed by methods, such as a chemical vapor deposition (CVD) method or an atomic layer deposition (ALD) method. The inorganic layers 681, 683 and 685 may prevent or efficiently reduce permeation of, primarily, moisture and oxygen. Permeation of moisture and oxygen into the light emitting element EE may be largely prevented by the inorganic layers 681, 683 and 685.

The organic layers 682 and 684 may include a polymer-based material. Examples of the polymer-based material may include, for example, an acrylic resin, an epoxy resin, a polyimide, and/or a polyethylene. In addition, the organic layers 682 and 684 may be formed by a thermal deposition process. The thermal deposition process for forming the organic layers 682 and 684 may be performed in a temperature range that may not damage the light emitting element EE.

The thin film encapsulation layer TFE may have a thickness of about 10 μm or less. Accordingly, an overall thickness of the display panel 600 may be small. By applying the thin film encapsulation layer TFE in such a manner, flexible characteristics of the display panel 600 may be improved.

The foldable display device according to the exemplary embodiments may be applied to a display device included in a computer, a notebook, a mobile phone, a smartphone, a smart pad, a PMP, a PDA, an MP3 player, or the like.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A foldable display device, comprising:
    a flexible display module including a bendable area having a folding axis and substantially planar members respectively located at opposite sides of the bendable area; and
    a support disposed on the flexible display module and including a hinge portion and support members, each of the support members being rotatably supported by one of opposite sides of the hinge portion,
    wherein:
    at least a portion of the folding axis overlaps at least one of the support members in a plan view; and
    a space between the support members is not parallel to the folding axis in a plan view.

2. The foldable display device of claim 1, wherein:
    the space between the support members does not overlap the folding axis in a plan view.

3. The foldable display device of claim 2, wherein the space between the support members is angled relative to the folding axis in a plan view.

4. The foldable display device of claim 1, wherein the space between the support members at least partially overlaps and is angled relative to the folding axis in a plan view.

5. The foldable display device of claim 1, wherein the space between the support members has a generally zigzag shape in a plan view.

6. The foldable display device of claim 5, wherein the zigzag shape has a bent portion that is angled.

7. The foldable display device of claim 6, wherein the bent portion has an acute angle shape, a right-angle shape, or an obtuse angle shape.

8. The foldable display device of claim 5, wherein the zigzag shape has a bent portion that is curved.

9. The foldable display device of claim 1, wherein the support comprises a case including the hinge portion; and
    the hinge portion includes rotating axes about which the support members respectively rotate, and
    the space between the support members is located between the rotating axes in a plan view.

10. The foldable display device of claim 9, wherein the rotating axes are symmetric with respect to the folding axis in a plan view.

11. The foldable display device of claim 1, further comprising:
    adhesive members respectively disposed between the substantially planar members and the support members; and
    spacers respectively disposed between the bendable area of the flexible display module and the support members.

12. The foldable display device of claim 11, wherein the spacers comprise step difference compensation members each of which has a thickness less than or equal to the thickness of each of the adhesive members.

13. The foldable display device of claim 11, wherein a space between the spacers has a width greater than a width of the space between the support members.

14. The foldable display device of claim 1, further comprising:
    an adhesive member disposed between the flexible display module and the support members.

15. The foldable display device of claim 14, wherein the adhesive member includes a first area overlapping the substantially planar members and attached to the support members and a second area overlapping the bendable area and not attached to the support members.

16. A foldable display device, comprising:
    a flexible display module including a bendable area having a folding axis and substantially planar members respectively located at opposite sides of the bendable area; and a support disposed on the flexible display module and including support members respectively supporting the planar members and spaced apart from each other with a space therebetween, wherein:

at least a portion of the folding axis does not overlap the space between the support members in a plan view; and the space between the support members is not parallel to the folding axis in a plan view.

17. The foldable display device of claim 16, wherein the space between the support members at least partially overlaps and is angled to the folding axis in a plan view.

18. The foldable display device of claim 16, wherein the space between the support members has a zigzag shape in a plan view.

* * * * *